United States Patent
Fujisawa

(10) Patent No.: US 8,208,340 B2
(45) Date of Patent: Jun. 26, 2012

(54) LATENCY COUNTER, SEMICONDUCTOR MEMORY DEVICE INCLUDING THE SAME, AND DATA PROCESSING SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 120 days.

(21) Appl. No.: 12/876,703

(22) Filed: Sep. 7, 2010

(65) Prior Publication Data
US 2011/0058445 A1 Mar. 10, 2011

(30) Foreign Application Priority Data
Sep. 8, 2009 (JP) ................................. 2009-207002

(51) Int. Cl.
*G11C 8/00* (2006.01)
(52) U.S. Cl. ................. 365/233.1; 365/236; 365/189.05
(58) Field of Classification Search ............... 365/233.1, 365/236, 189.05, 230.08, 219, 230.03, 230.06, 365/226, 207, 194
See application file for complete search history.

(56) References Cited

U.S. PATENT DOCUMENTS

| | | | | |
|---|---|---|---|---|
| 5,991,232 A | * | 11/1999 | Matsumura et al. | ........ 365/233.1 |
| 7,630,275 B2 | | 12/2009 | Fujisawa | |
| 2003/0147298 A1 | * | 8/2003 | Ooishi et al. | ................... 365/233 |

FOREIGN PATENT DOCUMENTS

JP 2008-047267 A 2/2008
* cited by examiner

*Primary Examiner* — Dang Nguyen
(74) *Attorney, Agent, or Firm* — Sughrue Mion, PLLC

(57) ABSTRACT

A latency counter includes an input selecting circuit that selects one of a plurality of signal paths and supplies an internal command to the selected signal path, a shift circuit that switches a correspondence relation between the signal paths and a latch circuit, and an output selecting circuit that causes the internal command taken in the latch circuit to be output. The input selection circuit includes a timing control circuit allocated to each of the signal paths. The timing control circuit includes an SR latch circuit that is set by the internal command and is reset in response to deactivation of a corresponding count value. Therefore, it becomes possible to suppress shortening of an active period of the internal command that is output from the input selecting circuit.

16 Claims, 13 Drawing Sheets

US 8,208,340 B2

LATENCY COUNTER, SEMICONDUCTOR MEMORY DEVICE INCLUDING THE SAME, AND DATA PROCESSING SYSTEM

BACKGROUND OF THE INVENTION

1. Field of the Invention

The present invention relates to a latency counter, and more particularly relates to a latency counter that counts a latency of an internal command within a synchronous memory. The present invention also relates to a semiconductor memory device including the latency counter, and a data processing system including the semiconductor memory device.

2. Description of Related Art

A synchronous memory represented by a synchronous DRAM (Dynamic Random Access Memory) is widely used for a main memory of a personal computer or the like. Because the synchronous memory can input and output data in synchronization with a clock signal supplied from a controller, a data transfer rate can be increased by using a faster clock.

However, even in the synchronous DRAM, operations performed by the DRAM core are only analog, and therefore it becomes necessary to amplify a very weak electric charge by performing a sense operation. Due to this, the duration between a time point at which a read command is issued and a time point at which first data is output cannot be shortened. Therefore, the first data is output, in synchronization with an external clock, after a predetermined delay time has elapsed from the time point at which the read command is issued.

This delay time is generally called "CAS latency" and it is set to an integral multiple of the clock cycle. For example, when the CAS latency is 5 (CL=5), the first data is output in synchronization with the external clock five cycles after the read command is retrieved in synchronization with the external clock. That is, the first data is output after five clock cycles have elapsed. A counter that counts such a latency is called "latency counter".

As the latency counter, there has been known a circuit described in US2008/0043566-A1, which is proposed by the present inventor.

As mentioned in US2008/0043566-A1, the latency counter counts the latency in synchronization with an internal clock generated by a DLL (Delay Locked Loop) circuit. On the contrary, an external command supplied from outside is issued in synchronization with an external clock. Consequently, when a jitter component exists in either the external clock or the internal clock, there is a problem that a latch margin of the internal command is reduced.

SUMMARY

In one embodiment, there is provided a latency counter that counts a latency of an internal command, the latency counter comprising a counter circuit that counts a clock signal and a point-shift FIFO circuit, wherein the point-shift FIFO circuit includes: a plurality of first latch circuits that latch the internal command; an input selecting circuit that supplies the internal command to one of a plurality of signal paths based on a count value of the counter circuit; a shift circuit that supplies the internal command on one of the signal paths to a predetermined one of the first latch circuits based on a preset correspondence relation between the signal paths and the first latch circuits; and an output selecting circuit that outputs the internal command stored in one of the first latch circuits based on the count value of the counter circuit, wherein the input selecting circuit includes a plurality of timing control circuits, each of the timing control circuits being allocated to an associated one of the signal paths, and each of the timing control circuits includes: a second latch circuit that latches the internal command; and a first gate circuit that outputs the internal command stored in the second latch circuit to an associated one of the signal paths in response to activation of a corresponding count value of the counter circuit, and wherein each of the second latch circuits is an SR latch circuit that is set in response to activation of the internal command and is reset in response to deactivation of the corresponding count value of the counter circuit.

According to the present invention, after an internal command is latched in an input selecting circuit, it is reset in response to an inactivation of a corresponding count value of a counter circuit. Therefore, even if a phase of an internal clock is delayed due to a jitter component, an active period of the input command that is output from the input selecting circuit is not shortened. Consequently, a reduction in a latch margin of the internal command due to the jitter component can be suppressed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
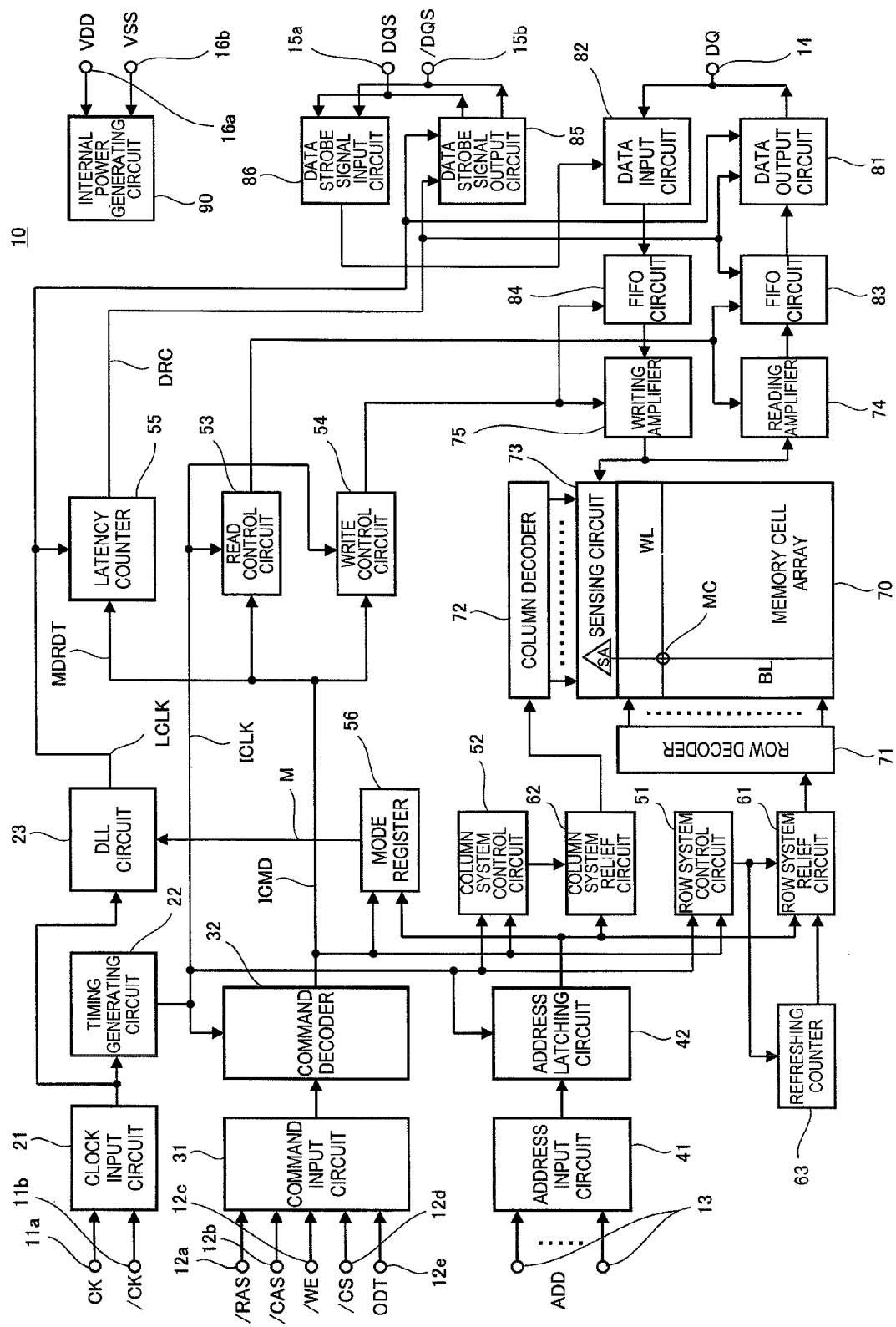
FIG. 1 is a block diagram showing whole constitution of a semiconductor memory device 10 according to an embodiment of the present invention.

FIG. 1 is a block diagram showing whole constitution of a semiconductor memory device 10 according to an embodiment of the present invention.

The semiconductor memory device 10 according to the present embodiment is a synchronous DRAM. The semiconductor memory device 10 includes, as external terminals, clock terminals 11a and 11b, command terminals 12a to 12e, address terminals 13, a data input and output terminal 14, data strobe terminals 15a and 15b, and power terminals 16a and 16b.

The clock terminals 11a and 11b are terminals to which clock signals CK and /CK are supplied, respectively. These clock signals CK and /CK are then supplied to a clock input circuit 21. In this specification, a signal with a "/ (slash)" at the beginning of the signal name means that the signal is an inverse signal or a low-active signal of a corresponding signal. Thus, the clock signals CK and /CK are complementary to each other. An output of the clock input circuit 21 is supplied to a timing generating circuit 22 and a DLL circuit 23. The timing generating circuit 22 generates an internal clock ICLK, and supplies the internal clock ICLK to various internal circuits except those that form a data output system. The DLL circuit 23 generates an output clock LCLK, and supplies the output clock LCLK to the circuits that form the data output system.

The output clock LCLK generated by the DLL circuit 23 is a phase-controlled signal of the clock signals CK and /CK. The phase of the output clock LCLK is advanced to some extent with respect to that of the clock signals CK and/CK so that the phase of read data DQ (and data strobe signals DQS and /DQS) matches with that of the clock signals CK and /CK.

The DLL circuit 23 can be made active or inactive according to the setting in a mode register 56. That is, when a "DLL on mode" is set in the mode register 56, the DLL circuit 23 is made active, and the phase of the output clock LCLK is controlled with respect to that of the clock signals CK and /CK. On the other hand, when a DLL off mode is set in the mode register 56, the DLL circuit 23 is made inactive, and the phase of the output clock LCLK is not controlled with respect to that of the clock signals CK and /CK. Thus, in the DLL off mode, the phase of the output clock LCLK is delayed with respect to that of the clock signals CK and /CK. The mode register 56 controls the DLL circuit 23 with a mode signal M.

The command terminals 12a to 12e are terminals to which a row address strobe signal /RAS, a column address strobe signal /CAS, a write enable signal /WE, a chip selection signal /CS, and an on-die termination signal ODT, respectively, are supplied. These command signals are supplied to a command input circuit 31. From the command input circuit 31, these command signals are supplied to a command decoder 32. The command decoder 32 is a circuit that generates various internal commands ICMD by performing retaining, decoding, and counting of the command signals in synchronization with the internal clock ICLK. The generated internal commands ICMD are supplied to a row system control circuit 51, a column system control circuit 52, a read control circuit 53, a write control circuit 54, a latency counter 55, and the mode register 56. Among the internal commands ICMD, an internal read command MDRDT is supplied at least to the latency counter 55.

In the present embodiment, the shortest cycle for command issuance (tCCD) of an external read command is four cycles. When the external read command is issued, the command decoder 32 generates the internal read command MDRDT twice with two clocks in between. Thus, in the present embodiment, the internal read command MDRDT remains active for two successive clock intervals at the shortest cycle.

The latency counter 55 is a circuit that generates an output control signal DRC by delaying the internal read command MDRDT such that the read data is output when a preset CAS latency elapses after the internal read command MDRDT is issued. While the internal read command MDRDT is synchronous with the internal clock ICLK, it is essential that the output control signal DRC that is the output of the latency counter 55 is synchronous with the output clock LCLK. Thus, the latency counter 55 also has a function of switching the target clock that is to be synchronized from the internal clock ICLK to the output clock LCLK. The latency counter 55 is explained later in detail.

The address terminals 13 are terminals to which an address signal ADD is supplied. The address signal ADD is then supplied to an address input circuit 41. An output of the address input circuit 41 is supplied to an address latching circuit 42. The address latching circuit 42 is a circuit that latches the address signal ADD in synchronization with the internal clock ICLK. Of the address signal ADD that is latched in the address latching circuit 42, a row address part is supplied to a row system relief circuit 61, and a column address part is supplied to a column system relief circuit 62. A row address generated by a refreshing counter 63 is also supplied to the row system relief circuit 61. Furthermore, when there is an entry in a mode register set, the address signal ADD is supplied to the mode register 56.

When a row address that corresponds to a defective word line is supplied, the row system relief circuit 61 relieves that row address by switching access to a redundant word line instead of the defective word line. The operation of the row system relief circuit 61 is controlled by the row system control circuit 51. An output of the row system relief circuit 61 is supplied to a row decoder 71. When a row address that does not correspond to a defective word line is supplied, the row system relief circuit 61 supplies that row address to the row decoder 71 as it is. The row decoder 71 is a circuit that selects one word line from among a plurality of word lines WL of a memory cell array 70. The word lines WL and a plurality of bit lines BL are arranged inside the memory cell array 70 in an intersecting manner. Memory cells MC are arranged at the intersection points of the word lines WL and the bit lines BL (only one word line WL, bit line BL, and memory cell MC are shown in FIG. 1). Each bit line BL is connected to a corresponding one of sensing amplifiers SA in a sensing circuit 73.

When a column address that corresponds to a defective bit line is supplied, the column system relief circuit 62 relieves that column address by switching access to a redundant bit line instead of the defective bit line. The operation of the column system relief circuit 62 is controlled by the column system control circuit 52. An output of the column system relief circuit 62 is supplied to a column decoder 72. When a column address that does not correspond to a defective bit line is supplied, the column system relief circuit 62 supplies that column address to the column decoder 72 as it is. The column decoder 72 is a circuit that selects one sensing amplifier from among the sensing amplifiers SA included in the memory cell array 70.

The sensing amplifier SA selected by the column decoder 72 is connected to a reading amplifier 74 during a reading operation and connected to a writing amplifier 75 during a writing operation. The operation of the reading amplifier 74 is controlled by the read control circuit 53, and the operation of the writing amplifier 75 is controlled by the write control circuit 54.

The data input and output terminal 14 is a terminal that outputs the read data DQ and inputs write data DQ. The data input and output terminal 14 is connected to a data output circuit 81 and a data input circuit 82. The data output circuit 81 is connected to the reading amplifier 74 via a FIFO circuit 83. Thus, a plurality of prefetched read data DQ are burst-output from the data input and output terminal 14. The data input circuit 82 is connected to the writing amplifier 75 via a FIFO circuit 84. Thus, a plurality of write data DQ burst-input from the data input and output terminal 14 can be simultaneously written in the memory cell array 70.

The data strobe terminals 15a and 15b are terminals to which are input and from which are output the data strobe signals DQS and /DQS, respectively. The data strobe terminals 15a and 15b are connected to each of a data strobe signal output circuit 85 and a data strobe signal input circuit 86.

As shown in FIG. 1, the output clock LCLK generated by the DLL circuit 23 and the output control signal DRC generated by the latency counter 55 are supplied to each of the data output circuit 81 and the data strobe signal output circuit 85. The output control signal DRC is also supplied to the FIFO circuit 83.

The power terminals 16a and 16b are terminals to which power voltages VDD and VSS, respectively, are supplied. Each of the power terminals 16a and 16b are connected to an internal power generating circuit 90. The internal power generating circuit 90 is a circuit that generates various internal voltages (not shown).

An overall configuration of the semiconductor memory device 10 is as described above. The latency counter 55 included in the semiconductor memory device 10 is explained next.

Figure 2:
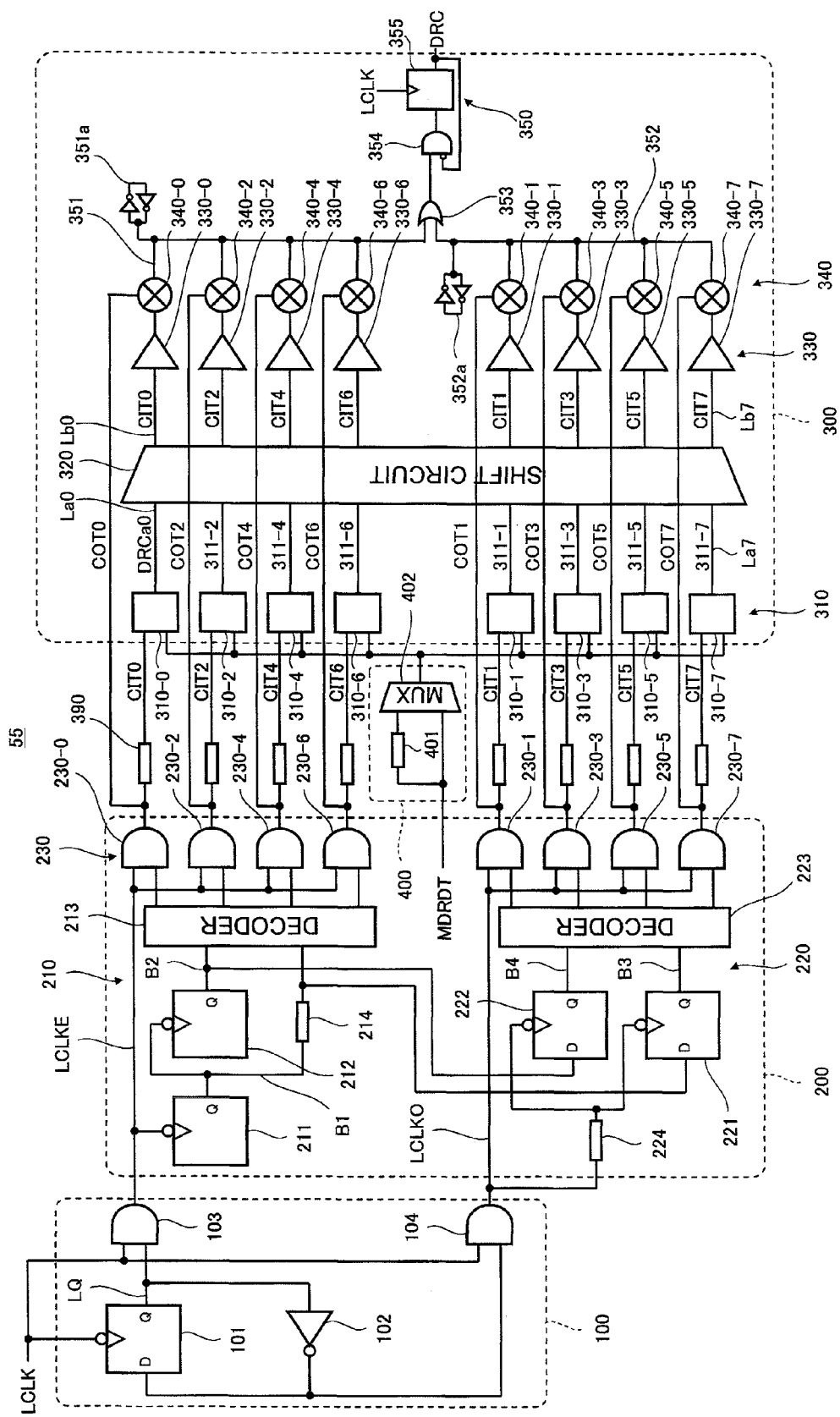
FIG. 2 is a circuit diagram of the latency counter 55 according to the present embodiment.

FIG. 2 is a circuit diagram of the latency counter 55 according to the present embodiment.

As shown in FIG. 2, the latency counter 55 according to the present embodiment includes a frequency-dividing circuit 100 that generates frequency-divided clocks LCLKE and LCLKO based on the output clock LCLK, a counter circuit 200 that performs a counting operation based on the frequency-divided clocks LCLKE and LCLKO, and a point-shift FIFO circuit 300 that counts a latency of the read command MDRDT based on a count value counted by the counter circuit 200. In this specification, the term "counter circuit" includes both the frequency-dividing circuit 100 and the counter circuit 200.

The output clock LCLK is a clock that is generated by the DLL circuit 23 shown in FIG. 1. During a self-refresh mode or a power-down mode, the operation of the DLL circuit 23 is stopped to reduce power consumption. Therefore, at a time point of returning from the self-refresh mode or the power-down mode, an operation of the DLL circuit 23 is restarted, and at this instance, the output clock LCLK becomes temporarily unstable, and due to this a hazard may be output.

Such a hazard generally causes the latency counter to malfunction. However, in the latency counter 55 according to the present embodiment, even if a hazard occurs in the output clock LCLK, the count value merely jumps, that is, it neither become unstable nor causes malfunction of the latency counter 55.

A configuration of each of the circuit blocks constituting the latency counter 55 and an operation thereof are explained next.

The frequency-dividing circuit 100 is explained first.

As shown in FIG. 2, the frequency-dividing circuit 100 includes a latch circuit 101 that performs a latching operation in synchronization with a falling edge of the output clock LCLK, an inverter 102 that inverts a frequency-divided signal LQ output from an output terminal Q of the latch circuit 101 and supplies the inverted frequency-divided signal LQ to an input terminal D, and an AND circuit 103 that performs an AND operation on the output clock LCLK and the frequency-divided signal LQ, and an AND circuit 104 that performs an AND operation on the output clock LCLK and the inverted frequency-divided signal LQ.

Figure 3:
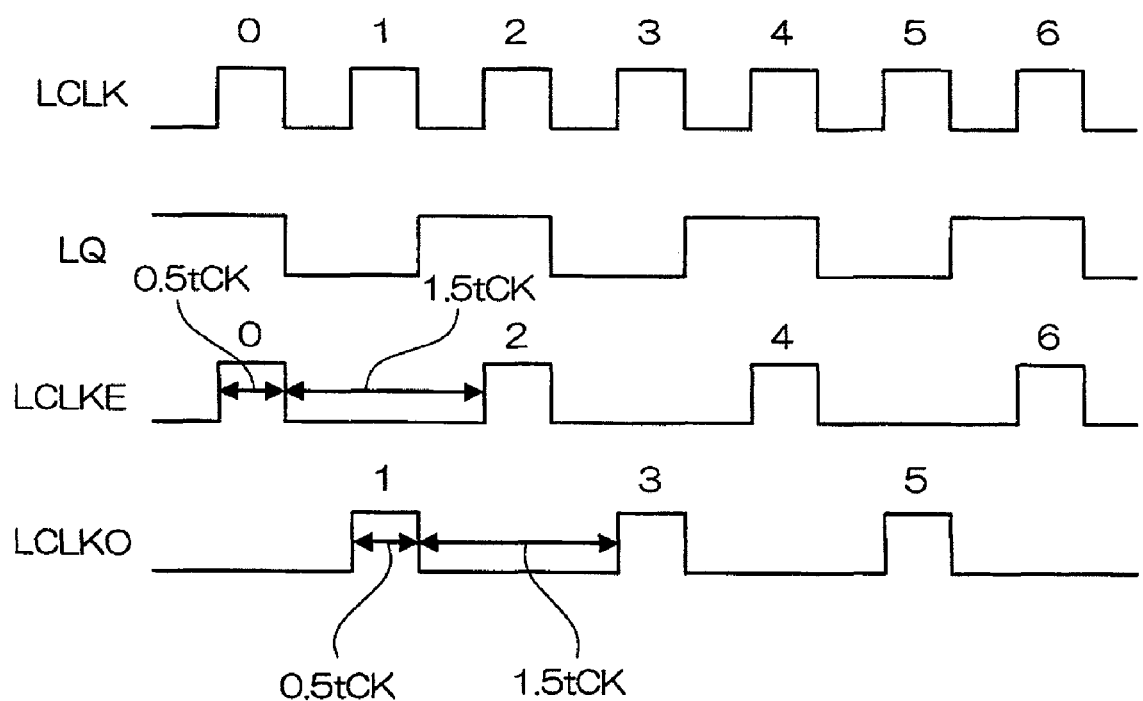
FIG. 3 is a timing chart for explaining the operation of the frequency-dividing circuit 100.

In such a circuit configuration, as shown in FIG. 3, the frequency-divided clock LCLKE which is an output of the AND circuit 103 has a waveform that matches with an even-numbered internal clock LCLK, and the frequency-divided clock LCLKO which is an output of the AND circuit 104 has a waveform that matches with an odd-numbered internal clock LCLK. Thus, for the frequency-divided clocks LCLKE and LCLKO, an active period (a high level period) is 0.5 tCK and an inactive period (a low level period) is 1.5 tCK.

Thus, the frequency-dividing circuit 100 according to the present embodiment divides the output clock LCLK into two to generate two frequency-divided clocks LCLKE and LCLKO, each having a different phase. The generated frequency-divided clocks LCLKE and LCLKO are, as shown in FIG. 2, supplied to the counter circuit 200. Thus, the counter circuit 200 operates at a frequency that is half of the frequency of the output clock LCLK.

The counter circuit 200 is explained next.

As shown in FIG. 2, the counter circuit 200 includes a first counter unit 210 that counts the frequency-divided clock LCLKE, a second counter unit 220 that retrieves the count value of the first counter unit 210 in synchronization with the frequency-divided clock LCLKO, and a selecting circuit 230 that selects either the count value of the first counter unit 210 or the count value of the second counter unit 220.

As shown in FIG. 2, the first counter unit 210 includes a 2-bit ripple counter having ripple flip-flops 211 and 212 connected in cascade and a decoder 213 that decodes the outputs of the ripple counter. A clock terminal of the flip-flop 211 is supplied with the frequency-divided clock LCLKE. Accordingly, an output bit B1 of the flip-flop 211 corresponds to a least significant bit of a binary signal. An output bit B2 of the flip-flop 212 corresponds to a most significant bit of the binary signal.

Each of the output bits B1 and B2 of the flip-flops 211 and 212 are supplied to the decoder 213. However, the output bits B1 and B2 do not change at the same timing, the change starts from lower-order bits. That is, the change of higher-order bits is delayed. In the present embodiment, a delay circuit 214 is used to eliminate this kind of difference in the change timings of the output bits B1 and B2. The delay circuit 214 has a delay amount that corresponds to one stage of the flip-flop. As shown in FIG. 2, the delay circuit 214 is connected between the flip-flop 211 and the decoder 213. Therefore, the output bit B1 of the flip-flop 211 is delayed by one stage of the flip-flop and thereafter it is input to the decoder 213.

As a result, the change timings of the output bits B1 and B2 that are input to the decoder 213 substantially match with each other. The decoder 213 causes any one of four (=$2^2$) outputs to become active to a high level based on the output bits B1 and B2 that are in a binary format.

The output of the decoder 213 changes with a delay with respect to the frequency-divided clock LCLKE because of the presence of the flip-flops 211 and 212 and the delay circuit 214. However, in the present embodiment, the first counter unit 210 is a ripple counter of only 2 bits, and the delay amount is very small. Therefore, a skew generated between the outputs of the decoder 213 and the frequency-divided clock LCLKE poses substantially no problem.

Meanwhile, the second counter unit 220 includes data latch flip-flops 221 and 222, and a decoder 223 that decodes the outputs of the flip-flops 221 and 222. Clock terminals of the flip-flops 221 and 222 are supplied with the frequency-divided clock LCLKO after the clock is delayed by a delay circuit 224. The output bit B1 of the flip-flop 211 is supplied to a data input terminal D of the flip-flop 221, and the output bit B2 of the flip-flop 212 is supplied to a data input terminal D of the flip-flop 222. Due to such a configuration, the second counter unit 220 can retrieve the count value of the first counter unit 210 in synchronization with the frequency-divided clock LCLKO. That is, when the frequency-divided clock LCLKO is activated, the count value of the second counter unit 220 matches the count value of the first counter unit 210.

Each of output bits B3 and B4 of the flip-flops 221 and 222 are supplied to the decoder 223. No delay circuit is inserted in a signal path of the output bits B3 and B4 since the output bits B3 and B4 change at the same timing. However, because the first counter unit 210 is a ripple counter as mentioned above, a total delay of two stages of the flip-flop occurs when the output bits B1 and B2 change. The second counter unit 220 is provided with the delay circuit 224 to correctly latch the output bits B1 and B2 that have such a delay. The delay circuit 224 has a delay amount that corresponds to two stages of the flip-flop. As shown in FIG. 2, the delay circuit 224 is inserted in the signal path of the frequency-divided clock LCLKO.

Thus, the change timing of output bits B3 and B4 input to the decoder 223 practically matches with the change timing of the output bits B1 and B2. The decoder 223 causes any one of four ($=2^2$) outputs to become active to a high level based on the output bits B3 and B4 that are in a binary format.

The selecting circuit 230 includes four AND circuits 230-0, 230-2, 230-4, and 230-6 corresponding to the outputs of the first counter unit 210, and four AND circuits 230-1, 230-3, 230-5, and 230-7 corresponding to the outputs of the second counter unit 220. One input terminal of each of the AND circuits 230-0, 230-2, 230-4, and 230-6 is supplied with the corresponding output bit of the first counter unit 210, and the other input terminal is supplied with the frequency-divided clock LCLKE. Likewise, one input terminal of each of the AND circuits 230-1, 230-3, 230-5, and 230-7 is supplied with the corresponding output bit of the second counter unit 220, and the other input terminal is supplied with the frequency-divided clock LCLKO.

Due to such a configuration, the output of the first counter unit 210 and the output of the second counter unit 220 are alternately selected, and the selected count value is supplied to the point-shift FIFO circuit 300. The count values of the counter circuit 200 are used as output-gate control signals COT0 to COT7.

Figure 4:
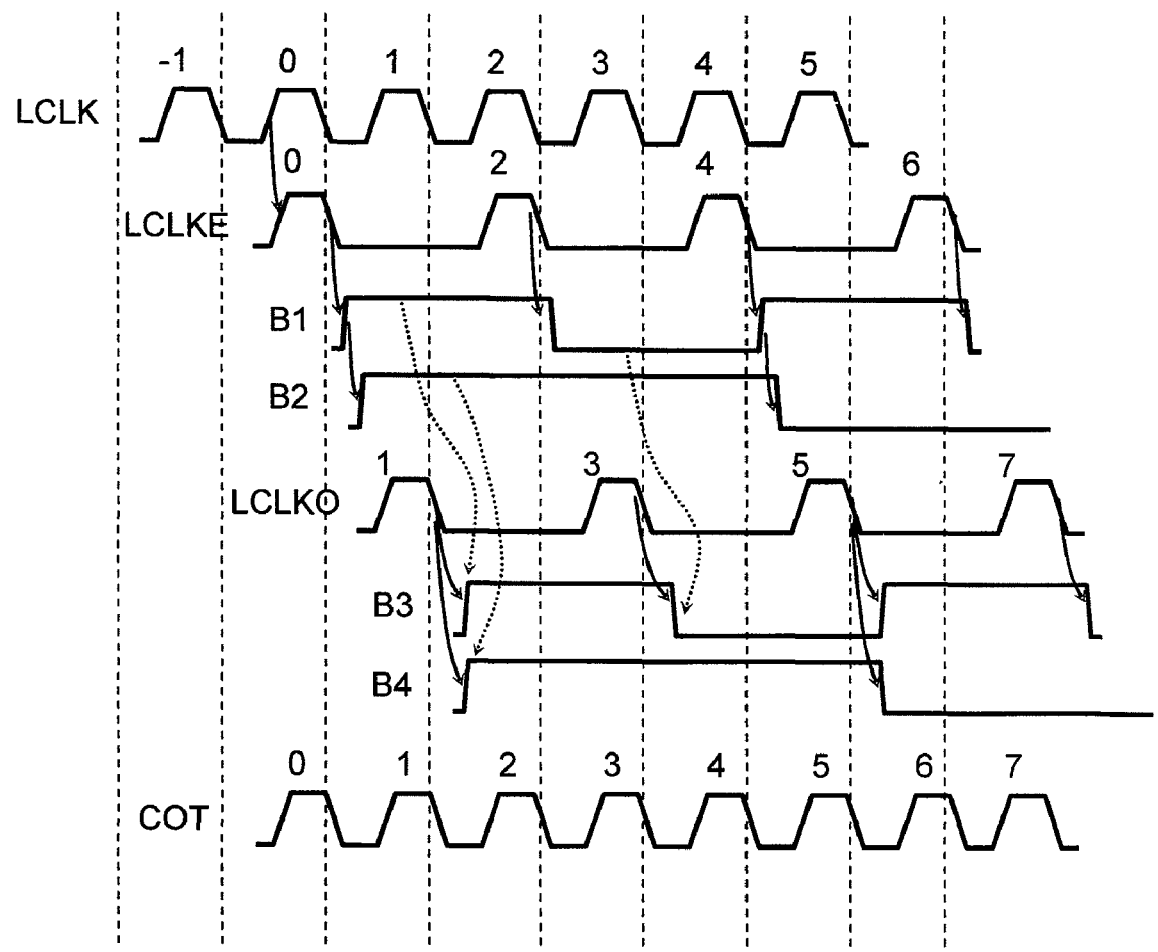
FIG. 4 is a timing chart for explaining the operation of the counter circuit 200.

FIG. 4 is a timing chart for explaining the operation of the counter circuit 200.

As shown in FIG. 4, the output bits B1 and B2, which represent the count value of the first counter unit 210, are incremented in synchronization with the frequency-divided clock LCLKE, and the output bits B3 and B4, which represent the count value of the second counter unit 220, are incremented in synchronization with the frequency-divided clock LCLKO. However, these incrementing operations are not performed independent of each other. That is, because the count value of the first counter unit 210 is retrieved as the count value of the second counter unit 220, the count value of the second counter unit 220 follows the count value of the first counter unit 210. Thus, when the count value of the first counter unit 210 jumps due to a hazard or the like, the count value of the second counter unit 220 also jumps by the same value. Thus, the count value of the first counter unit 210 and the count value of the second counter unit 220 are always incremented in a correlated manner.

The selecting circuit 230 selects the count value generated in this manner. That is, the selecting circuit 230 selects the count value of the first counter unit 210 during a period in which the frequency-divided clock LCLKE is high level, and it selects the count value of the second counter unit 220 during a period in which the frequency-divided clock LCLKO is high level. As a result, the count value of the counter circuit 200 is incremented in synchronization with the output clock LCLK. That is, the output gate control signals COT0 to COT7 are activated sequentially in that order.

When the count value of the first counter unit 210 jumps due to a hazard or the like, the order in which the output gate control signals COT0 to COT7 are activated varies unpredictably. However, because the count values output by the first counter unit 210 and the second counter unit 220 are in a binary format, there is no occurrence of erratic status such as a plurality of output gate control signals COT0 to COT7 being activated at the same time or none of the output gate control signals COT0 to COT7 being activated at all. That is, essentially only the count values jump. Further, because a hazard occurs when returning from the power-down mode and the like, the read command MDRDT is not stored in the point-shift FIFO circuit 300 that is explained later.

Thus, even if the count value jumps due to a hazard or the like, the counter circuit 200 is automatically restored, and it is possible to perform operations normally. The reason for this is that, the count value output from the counter circuit 200 in itself does not have a bearing on the normal operation of the point-shift FIFO circuit 300, and the normal operation can be performed until the count values change sequentially.

The point-shift FIFO circuit 300 is explained next.

As shown in FIG. 2, the point-shift FIFO circuit 300 includes an input selecting circuit 310, a shift circuit 320, a latch circuit 330, an output selecting circuit 340, and an output combining circuit 350.

The input selecting circuit 310 includes eight timing control circuits 310-0 to 310-7. The timing control circuits 310-0 to 310-7 are supplied with the read command MDRDT that has passed through a mode switching circuit 400 as well as input gate control signals CIT0 to CIT7. The input gate control signals CIT0 to CIT7 are output by delay circuits 390 by delaying the output gate control signals COT0 to COT7.

Figure 5:
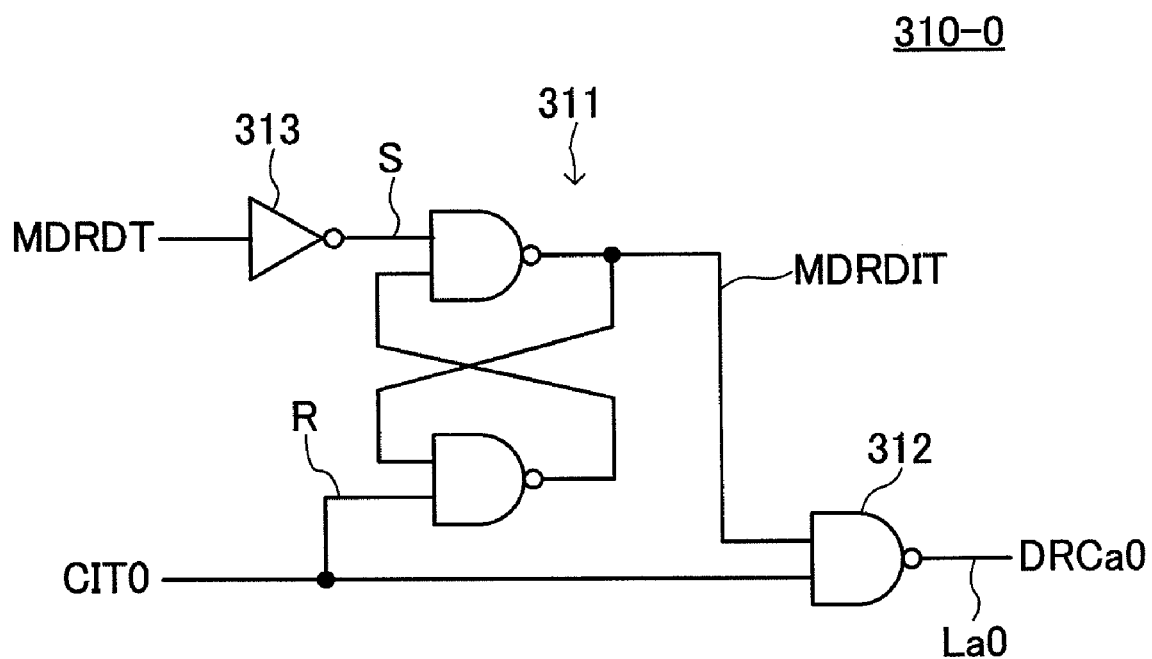
FIG. 5 is a circuit diagram of the timing control circuit 310-0.

FIG. 5 is a circuit diagram of the timing control circuit 310-0.

As shown in FIG. 5, the timing control circuit 310-0 includes an SR latch circuit 311 and an NAND gate 312 to which are input an output MDRDIT of the SR latch circuit 311 and the input gate control signal CIT0. A set terminal of the SR latch circuit 311 is supplied with the read command MDRDT which is inverted by an inverter 313. A reset terminal R of the SR latch circuit 311 is supplied with the input gate control signal CIT0. An output of the NAND gate 312 is connected to a corresponding signal path La0. The NAND gate 312 outputs an internal read command DRCa0 via the signal path La0. With such a configuration, the SR latch circuit 311 is set by the read command MDRDT, and it is reset in response to inactivation of the corresponding count value of the counter circuit 200 (the input gate control signal CIT0).

The circuit configuration of each of the remaining timing control circuits 310-1 to 310-7 is similar to that of the timing control circuit 310-0. The difference is that the input gate control signals CIT1 to CIT7 are input to the timing control circuits 310-1 to 310-7, respectively. Outputs of the timing control circuits 310-1 to 310-7 are connected to signal paths La1 to La7, respectively. The timing control circuits 310-1 to 310-7 output internal read commands DRCa1 to DRCa7 via the signal paths La1 to La7, respectively.

Figure 6:
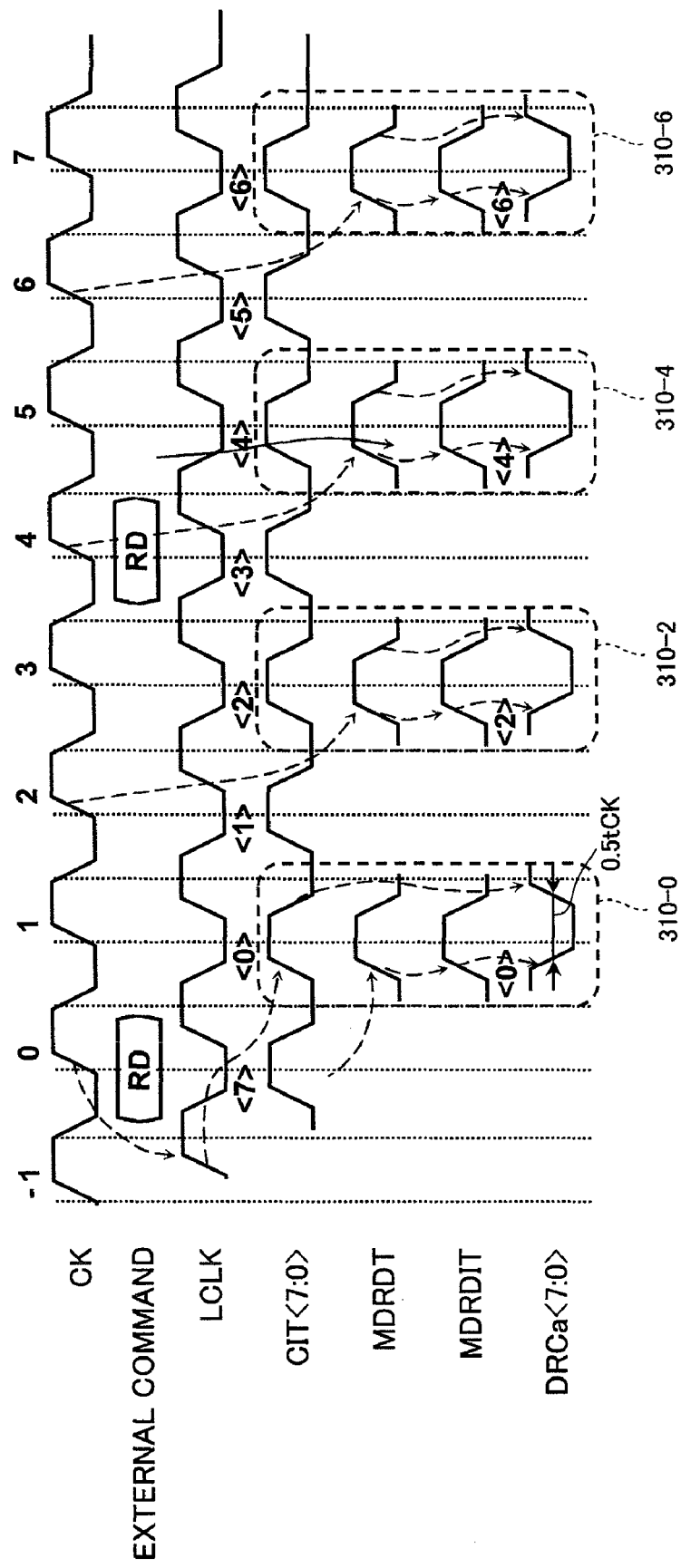
FIG. 6 is a timing chart for explaining the operation of the input selecting circuit 310.

FIG. 6 is a timing chart for explaining the operation of the input selecting circuit 310.

In the example shown in FIG. 6, the read command RD is issued in response to active edges 0 and 4 of the external clock CK, and in response to this, the internal read command MDRDT is generated corresponding to active edges 0, 2, 4, and 6 of the external clock CK. A certain delay is necessary between a time point at which the external read command RD is issued and a time point at which the internal read command MDRDT is generated. In the example shown in FIG. 6, this delay is of one clock cycle duration.

In FIG. 6, the portions denoted by reference numerals 310-0, 310-2, 310-4, and 310-6 represent timings when the timing control circuits 310-0, 310-2, 310-4, and 310-6, respectively, are in operation. In FIG. 6, a case is shown in which the output clock LCLK does not include a jitter component, and therefore, the waveforms of the input gate control signals CIT0, CIT2, CIT4, and CIT6 and those of the internal read commands MDRDT match substantially. In such a case, as shown in FIG. 6, an activation period (a low level period) of the read commands DRCa0, DRCa2, DRCa4, and DRCa6 output from the timing control circuits 310-0, 310-2, 310-4, and 310-6, respectively, is 0.5 tCK (tCK indicates a clock cycle).

Figure 7:
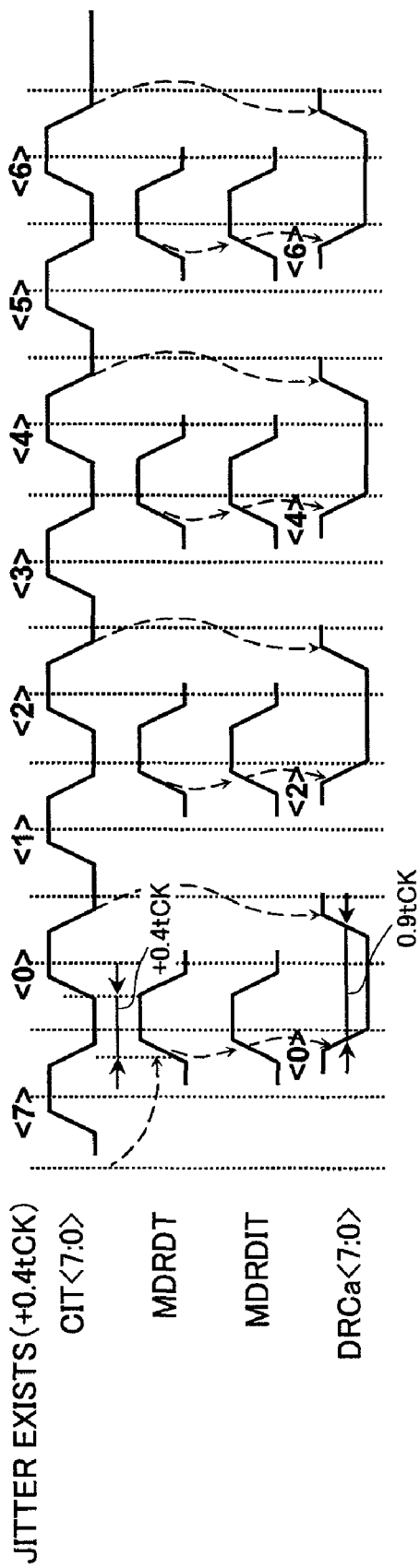
FIG. 7 is another timing chart for explaining the operation of the input selecting circuit 310.

FIG. 7 is another timing chart for explaining the operation of the input selecting circuit 310. This timing chart shows a case where the output clock LCLK is delayed to some extent (by +0.4 tCK) due to a jitter component.

As shown in FIG. 7, even if the output clock LCLK is delayed to some extent due to the jitter component, as it is clear from the circuit shown in FIG. 5, that the timings when the read commands DRCa0, DRCa2, DRCa4, and DRCa6 change from an inactive level (a high level) to an active level (a low level) correspond to a jitter-free period (the case shown in FIG. 6). The timings when the read commands DRCa0, DRCa2, DRCa4, and DRCa6 change from an active level (a low level) to an inactive level (a high level) are delayed for a period equivalent to the jitter component. However, as explained later, a latch timing of the latch circuit 330 is regulated by the timing when the read command changes from an inactive level (a high level) to an active level (a low level). Consequently, the delay mentioned above does not affect the operation of the circuit.

Figure 8:
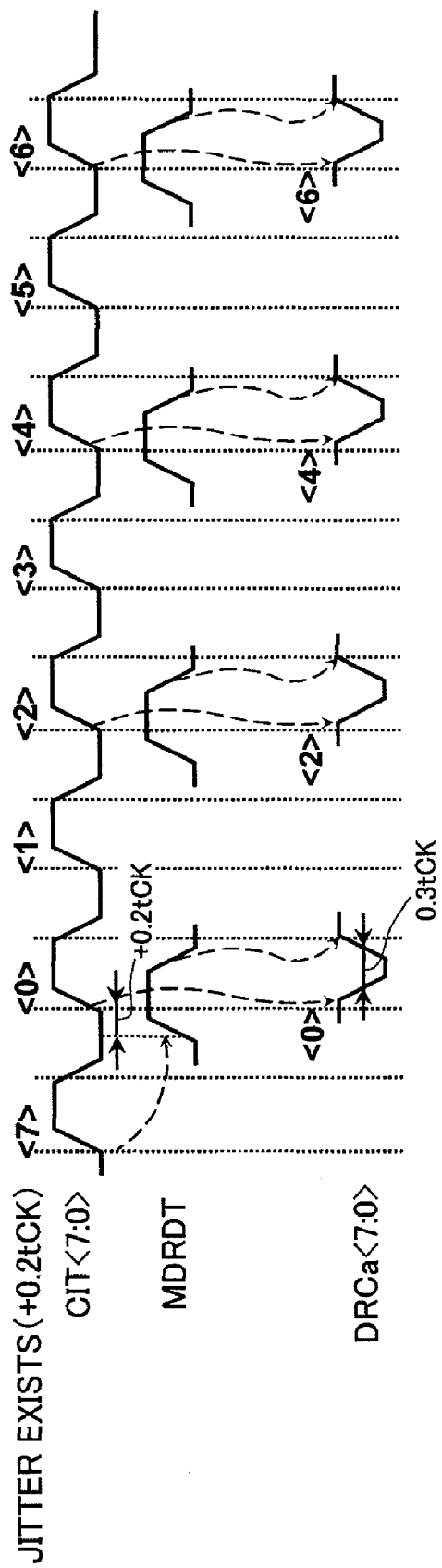
FIG. 8 is a timing chart for explaining the operation of an input selecting circuit of a comparative example.

FIG. 8 is a timing chart for explaining the operation of an input selecting circuit of a comparative example. The SR latch circuit 311 shown in FIG. 5 is not used in the input selecting circuit of the comparative example. That is, FIG. 8 represents an operation when the read command MDRDT and the input gate control signals CIT0 to CIT7 are directly input to the NAND gate 312, and the output clock LCLK is delayed to some extent (by +0.2 tCK) due to the jitter component as well as FIG. 7.

In the example shown in FIG. 8, when the output clock LCLK is delayed to some extent due to the jitter component, the timings when the read commands DRCa0, DRCa2, DRCa4, and DRCa6 change from an inactive level (a high level) to an active level (a low level) are also delayed for a period equivalent to the jitter component. As a result, the activation periods (a low level period) of the read commands DRCa0, DRCa2, DRCa4, and DRCa6 are shortened for a period equivalent to the jitter component (=0.3 tCK), and a latch margin of the latch circuit 330 is reduced.

In contrast, in the input selecting circuit 310 according to the present embodiment, even if the output clock LCLK is delayed due to the jitter component, the latch margin of the latch circuit 330 is not reduced.

The configuration and operations of the input selecting circuit 310 are as described above.

Thus, in the present embodiment, when the read command MDRDT is activated, one of the read commands DRCa0 to DRCa7 is supplied to the corresponding signal path La0 to La7 based on the count value of the counter circuit 200. For example, when the read command MDRDT is supplied during a period when the input gate control signal CIT0 is active, the read command DRCa0 is only supplied to the signal path La0. That is, the read commands DRCa1 to DRCa7 are not supplied to the other signal paths La1 to La7.

The signal paths La0 to La7 are connected to input terminals of the shift circuit 320. The shift circuit 320 connects the signal paths La0 to La7 on the input side to signal paths Lb0 to Lb7 on the output side based on a predefined correspondence relationship. Thus, the read command DRCa output from the input selecting circuit 310 is supplied as a read command DRCb to a predetermined one of the latch circuits 330-0 to 330-7.

Figure 9:
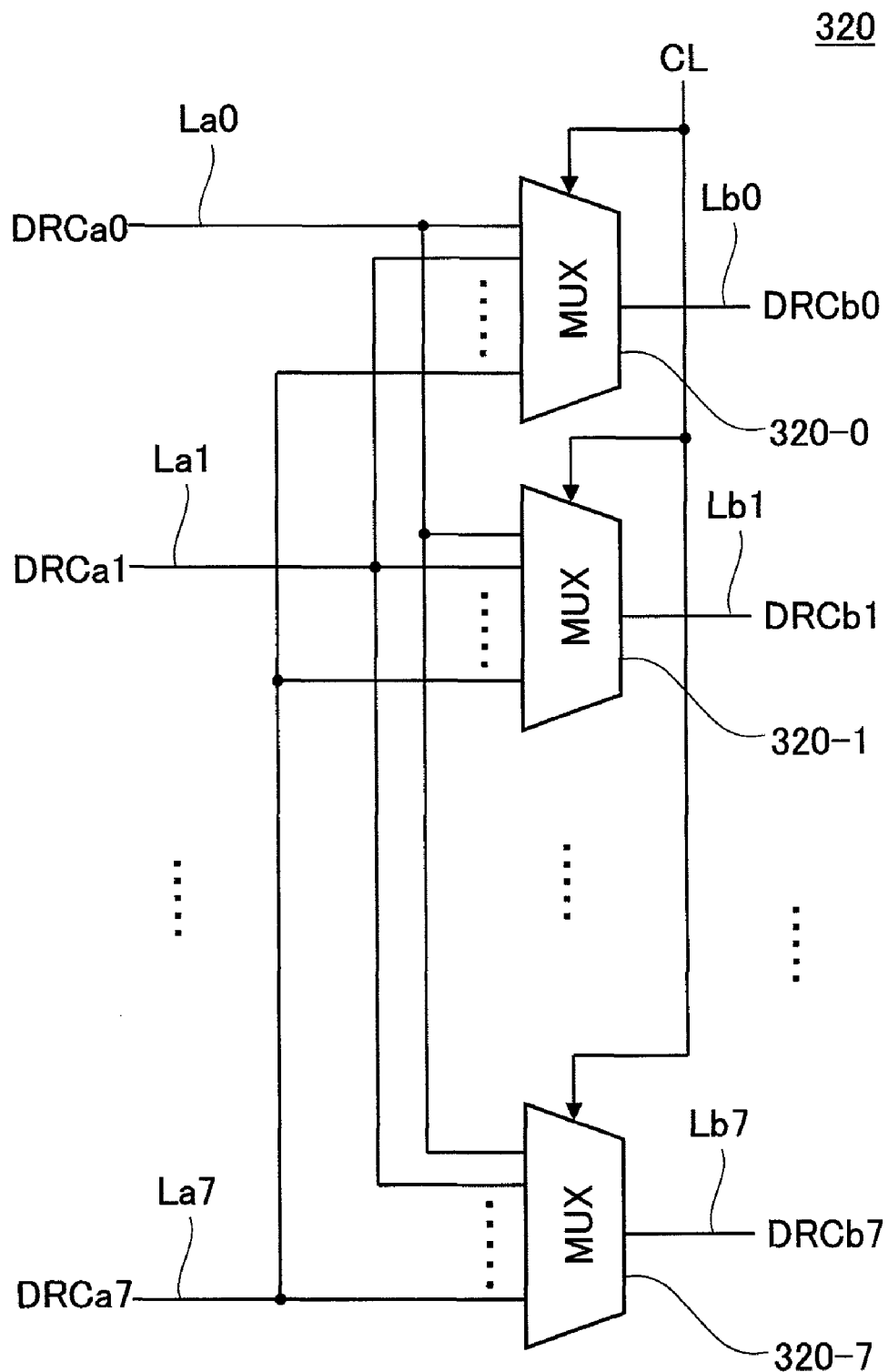
FIG. 9 is a circuit diagram of the shift circuit 320.

FIG. 9 is a circuit diagram of the shift circuit 320.

As shown in FIG. 9, the shift circuit 320 includes eight multiplexers 320-0 to 320-7. Input ends of the multiplexers 320-0 to 320-7 is connected to the signal paths La0 to La7. A read command DRCa0 to DRCa7 supplied to a predetermined one of the signal paths La0 to La7 is output as a read command DRCb0 to DRCb7 to the corresponding signal path Lb0 to Lb7 on the output side.

As to which of the signal paths Lb0 to Lb7 is output the read command DRCb0 to DRCb7 when which of the signal paths La0 to La7 is supplied the read command DRCa0 to DRCa7 totally differs depending on the multiplexers 320-0 to 320-7. A designation therefor is performed by a latency setting signal CL.

Figure 10A:
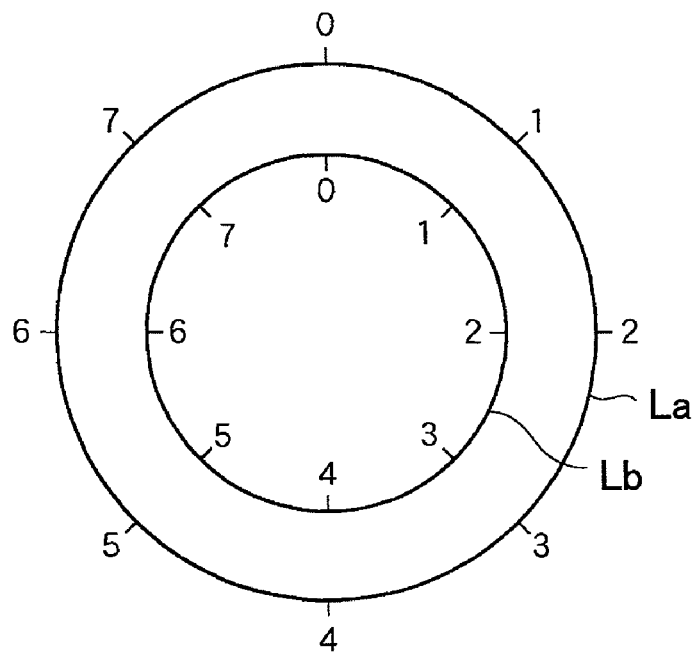
FIGS. 10A and 10B are schematic diagrams for explaining a function of the shift circuit 320.
Figure 10B:
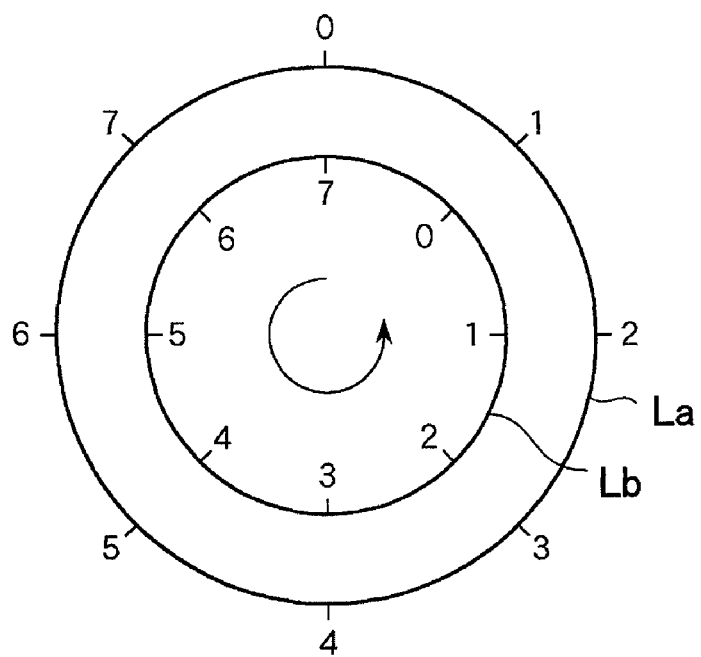

FIGS. 10A and 10B are schematic diagrams for explaining a function of the shift circuit 320.

Outer rings La shown in FIGS. 10A and 10B represent the signal paths La0 to La7 on the input side, and inner rings Lb represent the signal paths Lb0 to Lb7 on the output side. This means that the signal path that matches with the scale marking attached to these rings is the corresponding signal path.

More specifically, in the example shown in FIG. 10A, the difference between the signal paths La0 to La7 and the signal paths Lb0 to Lb7 has been set to "0". When a read command DRCak supplied to a signal path Lak (where k=0 to 7) is assumed to be output as a read command DRCbj from a signal path Lbj (where j=0 to 7), then a state of j=k is established.

On the other hand, in the example shown in FIG. 10B, the difference between the signal paths La0 to La7 and the signal paths Lb0 to Lb7 has been set to "7". When the read command DRCak supplied to the signal path Lak (k=0 to 7) is assumed to be output as the read command DRCbj from the signal path Lbj (where j=0 to 7), then a state of j−k=7 or j−k=−1 is established.

The difference can be set to any number from zero to seven. When the difference has been set, a correspondence relationship between the signal paths La on the input side and the signal paths Lb on the output side becomes fixed. Thus, the shift circuit 320 has a function of shifting the correspondence relationship between the signal paths La on the input side and the signal paths Lb on the output side based on the latency setting signal CL.

Thus, in the present embodiment, the input selecting circuit 310 is arranged on an earlier stage of the shift circuit 320. Consequently, when the read command MDRDT is activated, only one of the multiplexers 320-0 to 320-7 becomes operative. Therefore, reduction in power consumption is realized compared with the case in which all the multiplexers are active irrespective of whether the read command MDRDT is active.

The read commands DRCb0 to DRCb7 output from the shift circuit 320 are supplied to the latch circuits 330-0 to 330-7, respectively. At a next stage of the latch circuits 330-0 to 330-7 are connected output gates 340-0 to 340-7 constituting the output selecting circuit 340, respectively.

Figure 11:
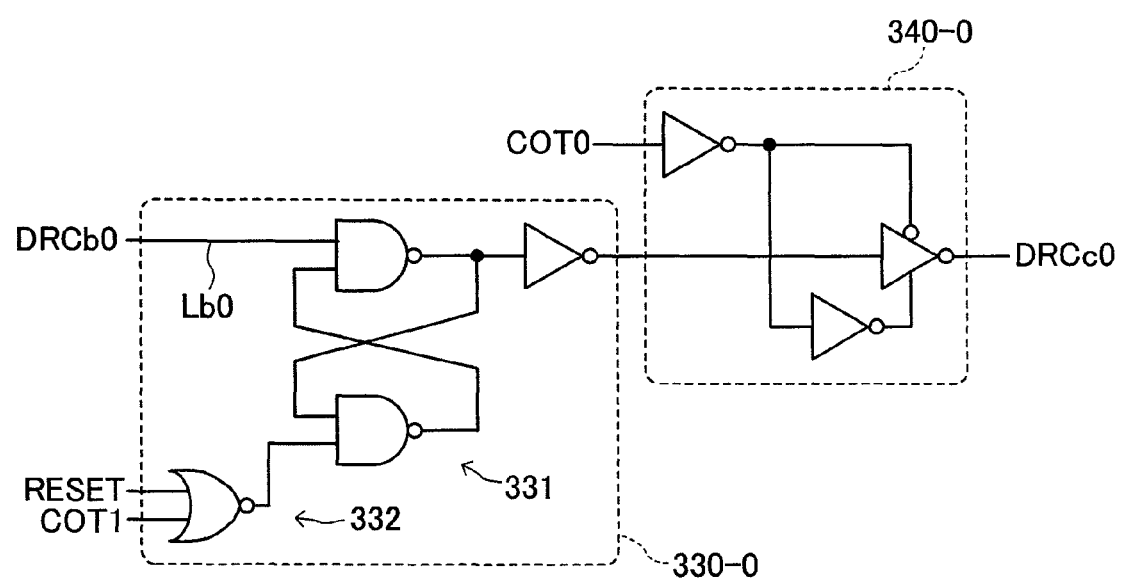
FIG. 11 is a circuit diagram of the latch circuit 330-0 and the output gate 340-0.

FIG. 11 is a circuit diagram of the latch circuit 330-0 and the output gate 340-0.

As shown in FIG. 11, the latch circuit 330-0 includes an SR latch circuit 331. The SR latch circuit 331 is set when the read command DRCb0, which is input via the signal path Lb0, changes from an inactive level (a high level) to an active level (a low level). The latch circuit 330-0 includes a reset circuit 332 that resets the SR latch circuit 331. The reset circuit 332 is supplied with a reset signal RESET and the next output gate control signal COT1. The SR latch circuit 331 is reset when either of these signals changes to a high level. When the corresponding output gate control signal is COTm (m=0 to 7), the term "next output gate control signal" refers to the output gate control signal COTm+1 or the output gate control signal COTm−7. That is, it refers to the output gate control signal that is activated during the next clock cycle of the corresponding output gate control signal.

The output gate 340-0 outputs a read command DRCc0, which has been latched in the SR latch circuit 331, during a period in which the output gate control signal COT0 is high level. The output is in a high impedance state during a period in which the output gate control signal COT0 is low level.

The rest of the latch circuits 330-1 to 330-7 have the same configuration as the latch circuit 330-0 shown in FIG. 11 except that they are set by the read commands DRCb1 to DRCb7 input via the corresponding signal paths Lb1 to Lb7, respectively, and are reset by the next output gate control signals COT2 to COT7 and COT0. Similarly, the rest of the output gates 340-1 to 340-7 have the same configuration as the output gate 340-0 except that they are activated by the corresponding output gate control signals COT1 to COT7, respectively.

Thus, in the present embodiment, the latch circuits are reset by the next output gate control signal. Consequently, there is no need to provide a circuit in each of the latch circuits for generating a one-shot pulse for resetting the latch circuit. As a result, the circuit scale and power consumption can be reduced. In the circuit shown in FIG. 11, even after the read command DRCc is output, the content of the latch circuit is retained until the next output gate control signal becomes active. However, even if the timing when the next read command DRCb is input to the latch circuit is the shortest, it is the same timing by which the output gate signal is delayed by the delay circuit 390 (a CIT activation timing). Consequently, no collision occurs between the commands. That is, the depth of the FIFO counter is not reduced.

Returning to FIG. 2, the output of the output selecting circuit 340 is supplied to the output combining circuit 350. The output combining circuit 350 outputs the output control signal DRC. The read commands DRCc0, DRCc2, DRCc4, and DRCc6 that are output from the output gates 340-0, 340-2, 340-4, and 340-6 are wired-ORed by a wiring 351, and the read commands DRCc1, DRCc3, DRCc5, and DRCc7 output from the output gates 340-1, 340-3, 340-5, and 340-7 are wired-ORed by a wiring 352. That is, each time the count value is refreshed, the output of a latch circuit belonging to a different group is selected sequentially.

The wirings 351 and 352 are connected to input terminals of an OR gate circuit 353. Latch circuits 351a and 352a are connected to the wirings 351 and 352, respectively, for retaining the wired-ORed read commands. Neither of the wirings 351 and 352 is provided with a reset circuit for resetting the wired-ORed read command. Therefore, once a read command is retained in the latch circuits 351a and 352a, it is retained until it is overwritten by another read command. Consequently, it takes two clock cycles to activate an output of the OR gate circuit 353. However, no collision occurs between the read command on the wiring 351 and the read command on the wiring 352. The reason for this is that, the shortest generation cycle of the internal read command MDRDT in the present embodiment is two clock cycles. That is, once a read command is output to one wiring, no command is output to the other wiring until the first wiring is reset.

The output of the OR gate circuit 353 passes through an AND gate 354, and is thereafter latched by a latch circuit 355, and output as the output control signal DRC. As explained with reference to FIG. 1, the output control signal DRC is supplied to each of the data output circuit 81, the data strobe signal output circuit 85, and the FIFO circuit 83, where it serves as a signal that regulates operation timings of these circuits.

The latch circuit 355 performs a latching operation in synchronization with the output clock LCLK. An output of the latch circuit 355 is inverted, and returned to the AND gate 354. Thus, an activation period of the output control signal DRC is shortened to half (that is, one clock cycle).

Thus, in the present embodiment, the outputs of the eight latch circuits 330-0 to 330-7 are divided into two groups, each of which is wired-ORed, and the wired-ORed outputs are further combined by the OR gate circuit 353. Due to such a configuration, an output load on the output gates 340-0 to 340-7 is reduced compared to a case where the outputs of all the eight latch circuits 330-0 to 330-7 are wired-ORed together. Consequently, the signal quality of the output control signal DRC can be enhanced.

Further, because the number of groups (two) and the shortest generation cycle of the internal read command MDRDT are the same, and each time the count value is refreshed, the output of the latch circuit belonging to a different group from the current group is selected sequentially, no collision occurs between the read command on the wiring 351 and the read command on the wiring 352 as described above. Therefore, no reset circuit needs to be provided for each of the wiring, and thus the circuit scale can be reduced.

Furthermore, in a case where the internal read command MDRDT is generated in two successive clock cycles, the waveforms on the wirings 351 and 352 do not change, and an active level (a high level) is maintained. Consequently, because no power is consumed in electrical charging and discharging, power consumption can be reduced.

In the present embodiment, the outputs of the latch circuit 330 are divided into two groups because the generation cycle of the internal read command MDRDT is 2 clock cycles at the shortest. However, the number of groups into which the outputs of the latch circuit 330 are to be divided can be determined based on the shortest generation cycle of the internal read command MDRDT. Specifically, when the generation cycle of the internal read command MDRDT is n clock cycles at the shortest, the outputs of the latch circuit 330 can be divided into n groups, and each group can be wired-ORed. In such a case, the activation period of the output of the OR gate circuit 353 increases to n clock cycles; however, the activation period of the output control signal DRC is shortened by 1/n (one clock cycle) by the AND gate 354 and the latch circuit 355.

As shown in FIG. 2, the latency counter 55 according to the present invention further includes the mode switching circuit 400.

The mode switching circuit 400 includes a delay circuit 401 that delays the read command MDRDT and a multiplexer 402 that selects either a non-delayed read command MDRDT or a delayed read command MDRDT based on a mode signal.

In an operation mode in which the DLL circuit 23 is made active (the DLL on mode), the multiplexer 402 selects the non-delayed read command MDRDT. Thus, the read command MDRDT can be supplied fast to the point-shift FIFO circuit 300. On the other hand, in an operation mode in which DLL circuit 23 is not made active (the DLL off mode), the multiplexer 402 selects the delayed read command MDRDT that is delayed by the delay circuit 401. Thus, the read command MDRDT is supplied to the point-shift FIFO circuit 300 with a delay with respect to the DLL on mode.

Preferably, a delay amount of the delay circuit 401 is set equivalent to the delay of the output clock LCLK generated for the external clock signal CK when the DLL circuit 23 is not active. By setting the delay amount in this manner, even if the output clock LCLK is delayed with respect to the clock signal CK, an operation margin that is same as that in the DLL on mode can be ensured in the DLL off mode.

The configuration of the latency counter 55 is as described above. An operation of the latency counter 55 is explained next.

Figure 12:
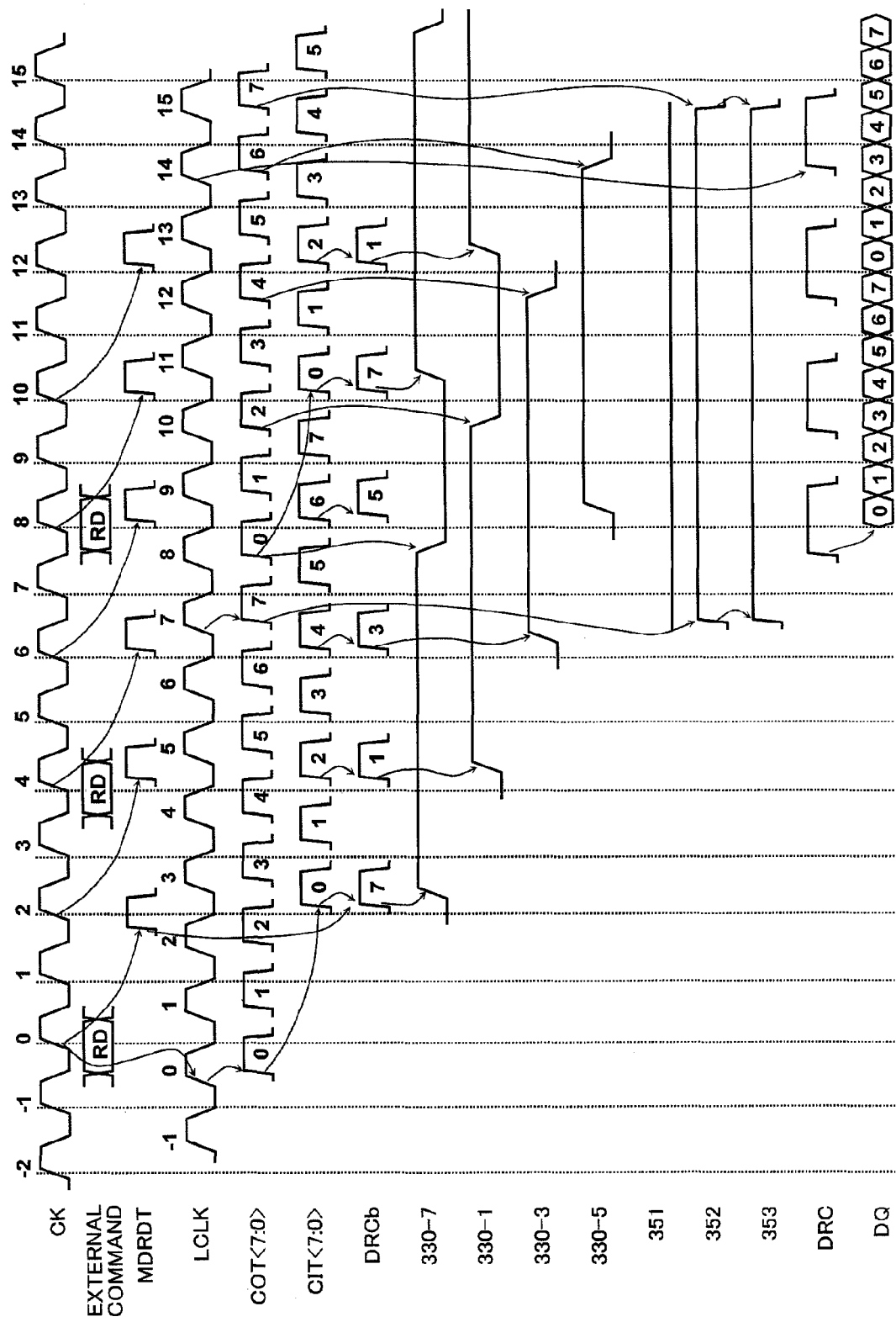
FIG. 12 is a timing chart for explaining the operation of the latency counter 55.

FIG. 12 is a timing chart for explaining the operation of the latency counter 55 according to the present embodiment, and it shows a state that the internal read command DRCb is latched in the latch circuit 330.

In the example shown in FIG. 12, the read command RD is issued synchronously with edges 0, 4, and 8 of the external clock signal CK. As shown in FIG. 8, a certain delay occurs between a time point at which the read command RD is issued and a time point at which the internal read command MDRDT is generated. When the read command RD is issued from outside, the command decoder 32 generates the internal read command MDRDT twice with two clocks in between. Thus, in the current example, the read command MDRDT is generated corresponding to edges 0, 2, 4, 6, 8, and 10 of the clock signal CK.

The generated read command MDRDT is retained in one of the eight latch circuits 330-0 to 330-7 included in the point-shift FIFO circuit 300 based on the output of the counter circuit 200. In the current example, the input gate control signal CIT0 becomes active at a time point at which the read command MDRDT is generated for the first time, and represents a case where the read command is stored in the latch circuit 330-7 because of a shifting operation of the shift circuit 320. The second and subsequent read commands MDRDT are stored sequentially in the latch circuits 330-1, 330-3, 330-5, 330-7, and 330-1, respectively.

The read command DRCb7 stored in the latch circuit 330-7 is retained there until it is reset by the next output gate control signal COT0 becoming active due to the increment operation of the counter circuit 200. At the timing just before resetting occurs and when the output gate control signal COT7 is still active, the output gate 340-7 opens, and the output control signal DRCc7 becomes active. The output control signal DRCc7 remains active for two clock cycles. Then, the output control signal DRCc7 is converted into a signal of one clock width by the AND gate 354 and the latch circuit 355 and it is output as the output control signal DRC. Subsequently, the data output circuit 81 shown in FIG. 1 actually outputs the read data DQ in synchronization with the output control signal DRC.

Thereafter, the logical level of the wiring 352 is maintained at a high level because the read commands stored sequentially in the latch circuits 330-1, 330-3, 330-5, 330-7, and 330-1 are output sequentially. On the other hand, the logical level of the wiring 351 is maintained at a low level because no read commands are stored in the latch circuits 330-0, 330-2, 330-4, and 330-6. Thus, when the read command MDRDT is activated for two successive clock cycles, only the latch circuits belonging to one group are used and the latch circuits belonging to the other group are not used.

Thereafter, when the mode is switched to the self-refresh mode or the power-down mode, the DLL circuit 23 shown in FIG. 1 becomes inactive. When returning to the normal operating mode, a hazard can occur in the output clock LCLK resulting in a jump in the count value of the counter circuit 200.

However, in the latency counter 55 according to the present embodiment, the count values in themselves do not have a bearing and no problem is likely to occur as long as an increment operation (or a decrement operation) is correctly performed on the normal operation. That is, the count value itself does not result into an error. Therefore, even if the count value varies due to a hazard, the subsequent operation can be performed as it is. Thus, in the latency counter 55 according to the present embodiment, an error due to the hazard of the output clock LCLK can be prevented from occurring.

As explained above, in the latency counter 55 according to the present embodiment, a counting operation is performed in synchronization with the frequency-divided clocks LCLKE and LCLKO obtained by frequency-dividing the output clock LCLK. Consequently, even if a frequency of the output clock LCLK is high, an adequate operating margin of the counter circuit 200 can be secured.

Furthermore, because the counter circuit 200 includes the first counter unit 210 and the second counter unit 220, the number of bits in the ripple counter of the first counter unit 210 is reduced. Due to this, the delay occurring in the ripple counter is reduced, enabling direct supply of the frequency-divided clocks LCLKE and LCLKO to the selecting circuit 230. That is, when the delay in the ripple counter is large, the frequency-divided clocks LCLKE and LCLKO need to be delayed to a certain extent before being input to the selecting circuit 230 to achieve correct synchronization. This will necessitate provision of a resynchronizing circuit to recover from the delay that will resynchronize the read command MDRDT to the output clock LCLK. However, when the clock frequency is high, the resynchronizing circuit can cause a reduction in a transfer margin of a command. However, such resynchronizing circuits are not required in the present embodiment. As a result, even if the clock frequency is high, an adequate transfer margin can be secured.

Furthermore, the first counter unit 210 counts the frequency-divided clock LCLKE in the binary format, while the second counter unit 220 retrieves the count value of the first counter unit 210 in synchronization with the frequency-divided clock LCLKO. Consequently, no mismatch occurs between the count values of the first counter unit 210 and the second counter unit 220. Thus, the read command MDRDT latched based on the count value of the first counter unit 210 can be output based on the count value of the second counter unit 220. The reverse is also possible. This signifies that the point-shift FIFO circuit 300 is not affected by the frequency division although the counting operation is performed synchronously with the frequency-divided clocks LCLKE and LCLKO.

That is, if the count values of the first counter unit 210 and the second counter unit 220 are not related, it becomes essential to output the read command MDRDT latched based on the count value of the first counter unit 210 based on the count value of the first counter unit 210. Similarly, it becomes essential to output the read command MDRDT latched based on the count value of the second counter unit 220 based on the count value of the second counter unit 220. In this case, a latency count that can be set in the point-shift FIFO circuit 300 will be limited to even numbers. A latency adding circuit and the like will be necessary to enable setting an odd number as the latency count. However, in the present embodiment, because the count values of the first counter unit 210 and the second counter unit 220 are linked, there are no constraints for setting the latency count nor is there a need to provide the latency adding circuit, and the latency count can be set as desired.

Furthermore, in the present embodiment, as explained above, because the first counter 210 is a ripple counter, errors due to a hazard of the output clock LCLK can be prevented from occurring.

Further, in the present embodiment, the input selecting circuit 310 is arranged on an earlier stage of the shift circuit 320. Therefore, because the shift circuit 320 is made operative only when the read command MDRDT is supplied, the power consumption is reduced as compared to a case where the shift circuit is always operative irrespective of whether the read command MDRDT is supplied.

Moreover, in the present embodiment, each SR latch circuit 311 is provided in each of the timing control circuits 310-0 to 310-7 that constitute the input selecting circuit 310. The SR latch circuit 311 is set by the read command MDRDT and reset by the inactivation of the corresponding input gate selection signal. Consequently, even if a delay occurs in the output clock LCLK due to the jitter component, there is no decrease in a window width of the read command DRCa. Consequently, there is no reduction in the latch margin of the latch circuit 330.

Furthermore, in the present embodiment, after the read command DRCb latched in the latch circuit 330 is output by the corresponding output gate control signal, the latch circuit 330 is reset by the next output gate control signal. Consequently, there is no need to provide a circuit or the like in each of the latch circuits for generating the one-shot pulse for resetting the latch circuit. As a result, the circuit scale and power consumption can be reduced.

Further, in the present embodiment, the eight latch circuits 330-0 to 330-7 are divided into groups and each group is wired-ORed so that each time the count value is refreshed, a latch circuit of a different group is sequentially selected for output. Consequently, the output load on the output gates 340-0 to 340-7 is reduced compared to the case where the outputs of all the eight latch circuits 330-0 to 330-7 are wired-ORed together. Moreover, no reset circuit needs to be provided for the wired-ORed wirings, and thus the circuit scale can be reduced. Furthermore, in the case where an external read command is generated in two successive clock cycles, the waveforms on the wirings 351 and 352 do not change, and an active level (a high level) is maintained. Consequently, no power is consumed in electrical charging and discharging. Therefore, power consumption can be reduced.

Moreover, in the present embodiment, by employing the mode switching circuit 400, in the DLL off mode, the read command MDRDT is supplied with a delay with respect to the DLL on mode. Consequently, even if the output clock LCLK is delayed with respect to the external clock signal CK, an adequate margin that is similar to that in the DLL on mode can be ensured in the DLL off mode for retrieving the read command MDRDT.

Figure 13:
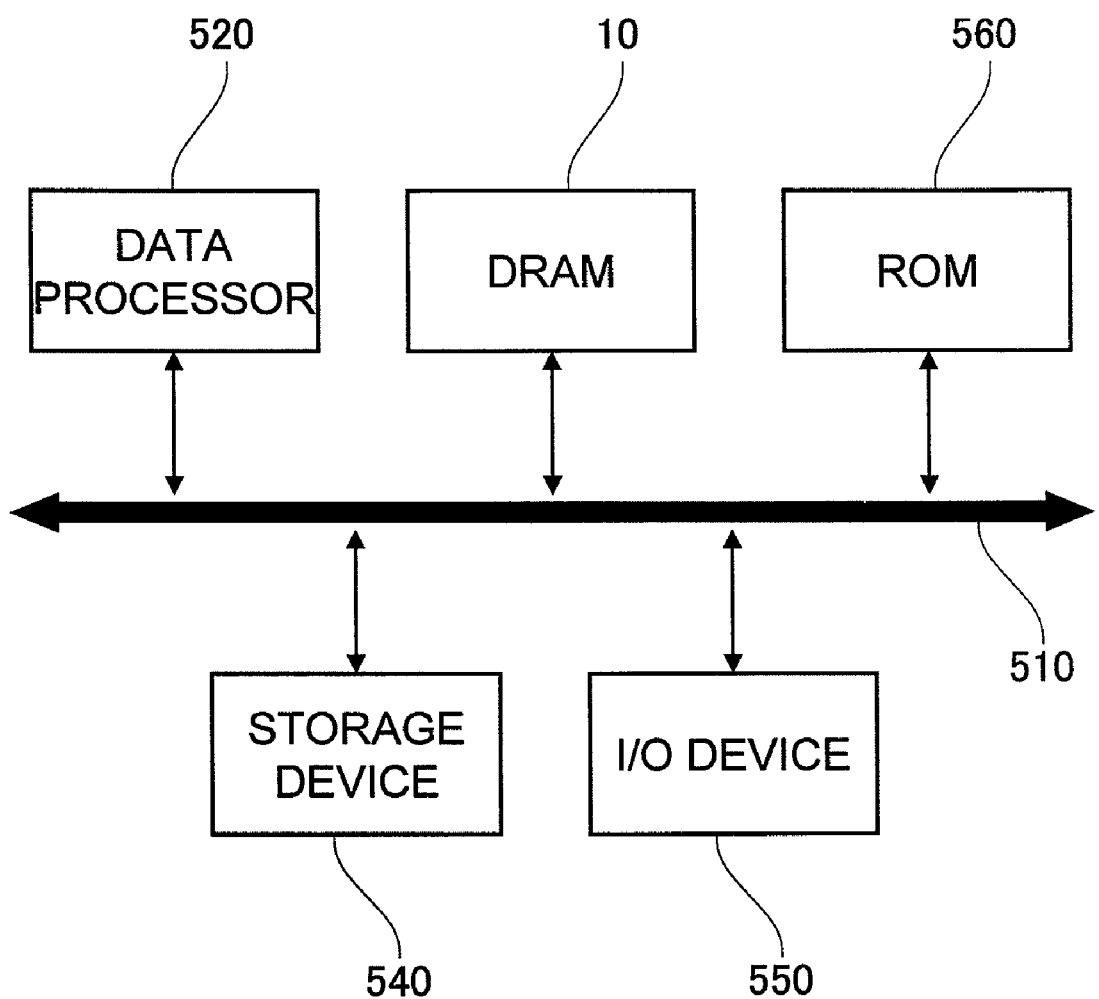
FIG. 13 is a block diagram of a data processing system 500 according to another embodiment of the present invention.

FIG. 13 is a block diagram of a data processing system 500 that includes the semiconductor memory device 10 according to another embodiment of the present invention.

In the data processing system 500 shown in FIG. 13, a data processor 520 and the semiconductor memory device (DRAM) 10 according to the present embodiment are interconnected via a system bus 510. For example, the data processor 520 can be a microprocessor (MPU), a digital signal processor (DSP) or the like, but is not limited thereto. For the sake of simplification, the data processor 520 and the semiconductor memory device 10 are shown to be connected via the system bus 510 in FIG. 13. Alternatively, the data processor 520 and the DRAM 10 can be connected by a local bus.

For the sake of simplification, only one set of the system bus 510 is shown in FIG. 13. Plural sets of system buses can be provided in series or parallel, as required, by connecting through one or more connectors. In the data processing system 500 shown in FIG. 13, a storage device 540, an I/O device 550, and a ROM 560 are connected to the system bus 510. However, these are not essential.

The storage device 540 can be a hard disk drive, an optical disk drive, a flash memory and the like. The I/O device 550 can be a display device such as a liquid crystal display and the like, and an input device such as a keyboard, a mouse and the like. Further, the I/O device 550 can be either the input device or the output device. For the sake of simplification, only one each of the constituent elements of the data processing system 500 is shown in FIG. 13. Two or more of all the constituent elements or a part thereof can be provided.

It is apparent that the present invention is not limited to the above embodiments, but may be modified and changed without departing from the scope and spirit of the invention.

For example, in the present invention, the circuit configuration of the counter circuit 200 is not particularly limited, and various well-known counter circuits can be used.

Furthermore, in the present embodiment, the frequency-dividing circuit 100 is used to frequency-divide the output clock LCLK into two. However, in the present invention, the frequency division is not limited to two. For example, when the output clock LCLK is a faster one, it suffices that the output clock LCLK can be frequency-divided into four, and a third counter unit and a fourth counter unit that are linked to the first counter unit 210, similarly to the second counter unit 220.

In the above embodiments, although the first counter unit 210 includes a ripple counter, the present invention is not limited thereto.

Furthermore, in the above embodiments, although the counter circuit 200 is used as a part of the latency counter 55, the use of the counter circuit according to the present invention is not limited thereto.

Further, in the present invention, it is not essential to provide the mode switching circuit 400.

Moreover, in the present invention, the circuit configurations of the latch circuit 330 and the output combining circuit 350 are not particularly limited, and circuits different from those explained in the above embodiments and can be used.

What is claimed is:

1. A latency counter that counts a latency of an internal command, the latency counter comprising:
    a counter circuit that counts a clock signal; and
    a point-shift FIFO circuit, wherein
    the point-shift FIFO circuit includes:
    a plurality of first latch circuits that latch the internal command;
    an input selecting circuit that supplies the internal command to one of a plurality of signal paths based on a count value of the counter circuit;
    a shift circuit that supplies the internal command on one of the signal paths to a predetermined one of the first latch circuits based on a preset correspondence relation between the signal paths and the first latch circuits; and
    an output selecting circuit that outputs the internal command stored in one of the first latch circuits based on the count value of the counter circuit, wherein the input selecting circuit includes a plurality of timing control circuits, each of the timing control circuits being allocated to an associated one of the signal paths, and each of the timing control circuits includes:
- a second latch circuit that latches the internal command; and
- a first gate circuit that outputs the internal command stored in the second latch circuit to an associated one of the signal paths in response to activation of a corresponding count value of the counter circuit, and wherein
- each of the second latch circuits is an SR latch circuit that is set in response to activation of the internal command and is reset in response to deactivation of the corresponding count value of the counter circuit.

2. The latency counter as claimed in claim 1, wherein each of the first latch circuits is an SR latch circuit that is set in response to activation of the internal command and is reset in response to activation of a different count value of the counter circuit from the corresponding count value.

3. The latency counter as claimed in claim 2, wherein each of the first latch circuits is reset in response to activation of a count value that is subsequent to the corresponding count value.

4. The latency counter as claimed in claim 1, wherein
the internal command is generated in n cycles of the clock signal at shortest,
the first latch circuits are divided into n groups,
outputs of the first latch circuits belonging to a same group are wired-ORed, and
the output selecting circuit selects one of the first latch circuits belonging to a group different from a current group each time the count value is updated.

5. The latency counter as claimed in claim 4, wherein the point-shift FIFO circuit further includes:
- a second gate circuit that combines outputs of the n groups; and
- a third gate circuit that shortens an activation period of the internal command output from the second gate circuit by 1/n.

6. The latency counter as claimed in claim 1, wherein the counter circuit includes:
- a dividing circuit that generates, based on the clock signal, a plurality of divided clocks that include at least a first divided clock and a second divided clock having mutually different phases;
- a first counter unit that counts the first divided clock;
- a second counter unit that takes in a count value of the first counter unit in synchronization with the second divided clock; and
- a selecting circuit that exclusively selects the count value of the first and second counter units.

7. The latency counter as claimed in claim 6, wherein the selecting circuit selects the count value of the first counter unit based on the first divided clock and selects the count value of the second counter unit based on the second divided clock.

8. The latency counter as claimed in claim 6, wherein the first counter unit includes a ripple counter that outputs a count value in a binary format.

9. The latency counter as claimed in claim 8, wherein the first counter unit includes a first delay circuit that matches a change timing of a plurality of bits that constitute the count value.

10. The latency counter as claimed in claim 6, wherein the second counter unit includes a second delay circuit that delays the second divided clock, and takes in the count value of the first counter unit in response to the second divided clock that is delayed by the second delay circuit.

11. The latency counter as claimed in claim 10, wherein an amount of delay of the second delay circuit is larger than an amount of delay of the first delay circuit.

12. The latency counter as claimed in claim 1, wherein the shift circuit can change the correspondence relation between the signal paths and the first latch circuits based on a setting signal.

13. The latency counter as claimed in claim 1, further comprising a mode switching circuit that supplies the internal command to the point-shift FIFO circuit relatively early in a first operation mode and supplies the internal command to the point-shift FIFO circuit relatively late in a second operation mode.

14. The latency counter as claimed in claim 13, wherein the first operation mode is a state where the clock signal is phase-controlled and the second operation mode is a state where the clock signal is not phase-controlled.

15. A semiconductor memory device comprising a latency counter that counts a latency of an internal command, wherein
the latency counter comprises:
- a counter circuit that counts a clock signal; and
- a point-shift FIFO circuit, wherein
the point-shift FIFO circuit includes:
- a plurality of first latch circuits that latch the internal command;
- an input selecting circuit that supplies the internal command to one of a plurality of signal paths based on a count value of the counter circuit;
- a shift circuit that supplies the internal command on one of the signal paths to a predetermined one of the first latch circuits based on a preset correspondence relation between the signal paths and the first latch circuits; and
- an output selecting circuit that outputs the internal command stored in one of the first latch circuits based on the count value of the counter circuit, wherein
the input selecting circuit includes a plurality of timing control circuits, each of the timing control circuits being allocated to an associated one of the signal paths, and
each of the timing control circuits includes:
- a second latch circuit that latches the internal command; and
- a first gate circuit that outputs the internal command stored in the second latch circuit to an associated one of the signal paths in response to activation of a corresponding count value of the counter circuit, and wherein
- each of the second latch circuits is an SR latch circuit that is set in response to activation of the internal command and is reset in response to deactivation of the corresponding count value of the counter circuit.

16. A data processing system comprising:
- a semiconductor memory device; and
- a data processor connected to the semiconductor memory device via a system bus, wherein
the semiconductor memory device comprises a latency counter that counts a latency of an internal command, wherein
the latency counter comprises a counter circuit that counts a clock signal and a point-shift FIFO circuit, wherein
the point-shift FIFO circuit includes:
- a plurality of first latch circuits that latch the internal command;
- an input selecting circuit that supplies the internal command to one of a plurality of signal paths based on a count value of the counter circuit;

a shift circuit that supplies the internal command on one of the signal paths to a predetermined one of the first latch circuits based on a preset correspondence relation between the signal paths and the first latch circuits; and an output selecting circuit that outputs the internal command stored in one of the first latch circuits based on the count value of the counter circuit, wherein the input selecting circuit includes a plurality of timing control circuits, each of the timing control circuits being allocated to an associated one of the signal paths, and each of the timing control circuits includes:

a second latch circuit that latches the internal command; and a first gate circuit that outputs the internal command stored in the second latch circuit to an associated one of the signal paths in response to activation of a corresponding count value of the counter circuit, and wherein each of the second latch circuits is an SR latch circuit that is set in response to activation of the internal command and is reset in response to deactivation of the corresponding count value of the counter circuit.

* * * * *